United States Patent [19]

Charruau

[11] Patent Number: 5,572,451
[45] Date of Patent: Nov. 5, 1996

[54] ORDERING OF NETWORK LINE SEGMENTS, IN PARTICULAR FOR CALCULATION OF INTERFERENCES BETWEEN LINES IN AN ELECTRICAL NETWORK

[75] Inventor: Stéphane Charruau, Eysines, France

[73] Assignee: Sextant Avionique, Meudon la Foret, France

[21] Appl. No.: 51,901

[22] Filed: Apr. 22, 1993

[30] Foreign Application Priority Data

Apr. 24, 1992 [FR] France .................... 92 05061

[51] Int. Cl.⁶ ..................... G06F 17/50; G06F 17/12; G06F 17/13
[52] U.S. Cl. ........................ 364/578; 364/488
[58] Field of Search ................. 364/488, 489, 364/490, 491, 578; 357/41, 42, 45

[56] References Cited

U.S. PATENT DOCUMENTS

| | | | |
|---|---|---|---|
| 3,638,202 | 1/1972 | Schroeder | 340/173 FF |
| 3,963,990 | 6/1976 | DiFonzo | 325/476 |
| 4,377,849 | 3/1983 | Finger et al. | 364/491 |
| 4,694,403 | 9/1987 | Nomura | 364/488 |
| 4,855,929 | 8/1989 | Nakajima | 364/490 |
| 4,970,664 | 11/1990 | Kaiser et al. | 364/521 |
| 5,010,493 | 4/1991 | Matsumoto et al. | 364/490 |
| 5,198,986 | 3/1993 | Ikeda et al. | 364/489 |
| 5,379,231 | 1/1995 | Pillage et al. | 364/488 |
| 5,392,222 | 2/1995 | Noble | 364/490 |

*Primary Examiner*—Kevin J. Teska
*Assistant Examiner*—Thai Phan
*Attorney, Agent, or Firm*—Pollock, Vande Sande & Priddy

[57] ABSTRACT

The invention concerns ordering of segments of lines in a network.

Since line segments may interact with each other, a principal rank is assigned to each segment, with principal ranks being incremented such that segments interacting with each other have principal ranks in which the difference is at most equal to one unit and all segments on the same line have the same rank.

10 Claims, 5 Drawing Sheets

ORDERING OF NETWORK LINE SEGMENTS, IN PARTICULAR FOR CALCULATION OF INTERFERENCES BETWEEN LINES IN AN ELECTRICAL NETWORK

BACKGROUND OF THE INVENTION

The invention concerns ordering of line segments in a network. It is particularly applicable to the calculation of interferences between line segments in particularly dense electrical networks in which the structure of matrices involved has to be simplified as much as possible, for example, by making them as close as possible to diagonal matrices.

More generally, the invention is applicable to the ordering of line segments in any network in which it is required to determine interactions between lines.

The increase in the calculation power of computers and microcomputers has been made possible due to the emergence and maturity of the very large scale integration technology, such as microprocessors designed for general digital information processing purposes or for difficult special cases, for example, such as the generation of three-dimensional synthetic pictures.

However the development of the very large scale integration (VLSI) technique has introduced some drastic design constraints on interconnection support substrates, for example, such as printed circuits or thin film ceramics. In practice a direct result of these constraints is the use of thinner and thinner dielectric insulation and printed conductors on interconnection substrates in order to reasonably limit the thickness of printed circuits. The reductions in the size of conductors and the thickness of dielectric insulation has also been combined with an increase microprocessor operating frequency, for example reaching 50 MHz. In particular, the combination of the above developments has led to the risk of deformation of electrical signals and the creation of parasite signals due to interference between several conductors containing some portions very close to other conductors. It therefore becomes essential to predict the existence of interference or parasite generation between lines during the design stage of printed circuits or interconnection substrates. Since these circuits are laid out in very dense networks, it is frequently no longer possible to correct them after manufacture and during debugging.

Digital simulations exist to predict this type of parasite generation. For example, starting from the electrical excitation of a line in a network, the result of the simulation indicates the generation of current and voltages produced on other lines in the network. Nevertheless, these simulations have to take account of the propagation of parasites due to closer and closer interference on lines progressively further away from the initially disturbing lines or by multiple reflections, and involve many calculation sequences that are expensive in computer CPU occupation time and in memory space. This disadvantage is particularly due to the fact that these simulations involve calculations on very large matrices, the sizes of which are difficult to determine beforehand as a function of physically significant interferences, and these matrices must be inverted.

Another problem is due to the fact that, since network lines are broken down into segments defined by automatic conductor definition constraints, the breakdown thus obtained is never optimized for analysis of interferences and cannot give an efficient solution to the problem of propagation of incident and reflected disturbances.

SUMMARY OF THE INVENTION

The purpose of the invention is to compensate for the above-mentioned disadvantages, particularly in breaking down network lines into segments and then creating an order of these segments so that the structure of solution matrices can be made similar to the structure of diagonal matrices in order to reduce calculation times and memory space requirements for digital simulation methods.

The objective of the invention is to create an order of line segments in a network, of segments that can interact with each other, wherein a principal rank is assigned to each segment, the principal ranks being incremented such that the maximum difference in the principal ranks of segments that interact with each other is one unit, and all segments in any one line have the same rank, with the origin rank being assigned to segments in a line containing at least one segment that interacts with a segment in another line.

Apart from the above mentioned advantages, the main advantages of the invention are that it enables simulation resources to be easily integrated into a computer assisted design method and that it improves the determination of parasiting phenomena between lines in a network.

BRIEF DESCRIPTION OF THE DRAWINGS

Other characteristics and advantages of the invention will become apparent in the following description which refers to the drawings in the appendix which represent.

DESCRIPTION OF THE INVENTION

Figure 1:
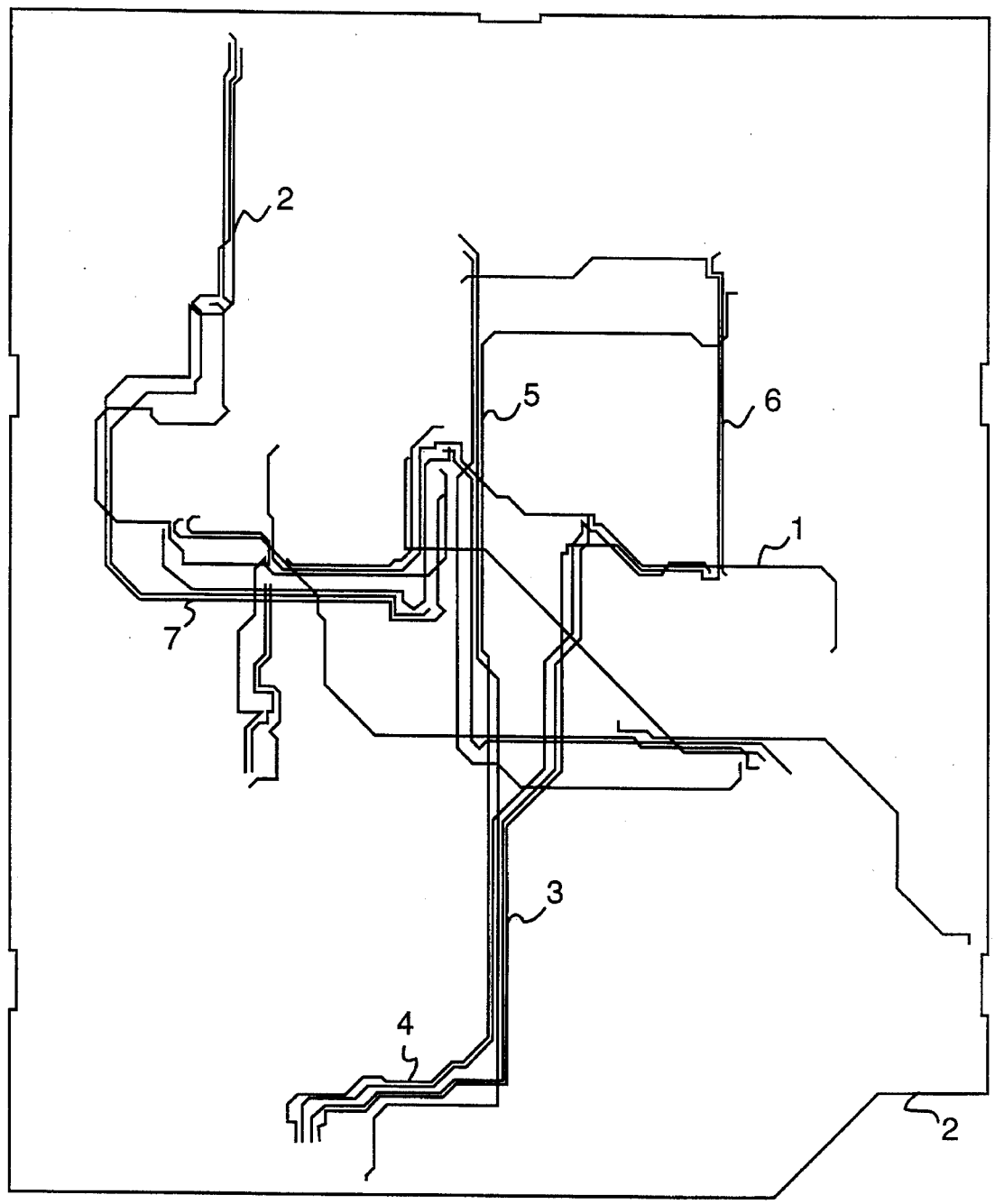
FIG. 1, a top view of a network of lines.

FIG. 1 presents a top view of a network of lines 1. For example, this could be a network of conductors on a multilayer printed circuit or an interconnections substrate 2. The lines shown appear to be superimposed and to cross each other, since they are actually on several different levels. In the case of electrical conductors, these levels are separated by insulating materials, particularly dielectrics. Groups 2, 3, 4, 5, 6 and 7 of very close portions of lines create zones in which interference phenomena are particularly likely to occur. One way of determining these phenomena is to activate one line and to observe currents and voltages induced in the other lines. In practice, this activation is done by simulation. For electrical lines, this simulation uses in particular, Maxwell's electromagnetism equations. The lines are firstly broken down into elementary segments using known methods. For example, the segments may be defined such that equations are solved by separating one space coordinate from the other two and ending up with an elementary matrix calculation, in other words by segment. Thus, if $I_{ns}$ and $V_{ns}$ represent values of the current and voltage at the output from an "isolated" segment, in other words they are not the source of an interference phenomenon, and $I_{ne}$ and $V_{ne}$ are the values of the current and voltage at the input to this segment, one way of determining $I_{ns}$ and $V_{ns}$ from $I_{ne}$ and $V_{ne}$ is to do an elementary matrix calculation defined by the following relation:

$$\begin{pmatrix} I_{ns} \\ V_{ns} \end{pmatrix} = (T) \begin{pmatrix} I_{ne} \\ V_{ne} \end{pmatrix} \qquad (1)$$

where (T) represents a square matrix of order 2 as a function of the length of the segment and the time, obtained by the solution of Maxwell's equations applied to the line segment.

When the segment is the source of an interference phenomenon, $I_{ns}$ and $V_{ns}$ are also a function of currents and voltages in adjacent line segments. This influence is also determined in a matrix calculation, for example, defined by the following relation written in the frequency domain:

$$\begin{pmatrix} I_{ns} \\ V_{ns} \end{pmatrix} = \sum_K (T_k) \begin{pmatrix} I_{ke} \\ V_{ke} \end{pmatrix} \qquad (2)$$

where $I_{ke}$ and $V_{ke}$ represent, for example, the current and voltage at the input to a line segment adjacent to the reference segment and interfering with it and $(T_k)$ represents a square matrix of order $\Sigma_2$, is the summation operator of matrix products for each segment interfering with the reference segment.

The current and voltage at each end of a given segment are obtained by concatenation of relations such as (2), written for all segments in all lines subject to direct or indirect interference with the line containing the initially chosen segment.

This concatenation leads to the definition of a matrix segment in the frequency domain such as:

$$(A)(X) = (B) \qquad (3)$$

where (X) is an unknown vector, (B) is a known vector and (A) is a known large square matrix..

In order to be efficient, the simulation must include currents and voltages at the ends of each segment. Therefore, this simulation involves the solution of a global matrix calculation in which the global transfer matrix is built up from previously defined elementary matrices. Since line networks to be processed are becoming more and more complex and contain increasing numbers of segments, the result is that the order of this global matrix is very high and can reach several thousand. This type of matrix is very expensive in memory space and generates long calculation times for inverse Fourier transformation or convolution products. Now each given segment interacts or is in an interference situation only with a limited number of other segments such that many elements in the global solution matrix are zero. In the absence of any particular ordering when building up the matrix, non-zero elements in the matrix will be distributed arbitrarily.

The method of ordering segments according to the invention groups non-zero elements in the global matrix, particularly around its diagonal.

Figure 2:
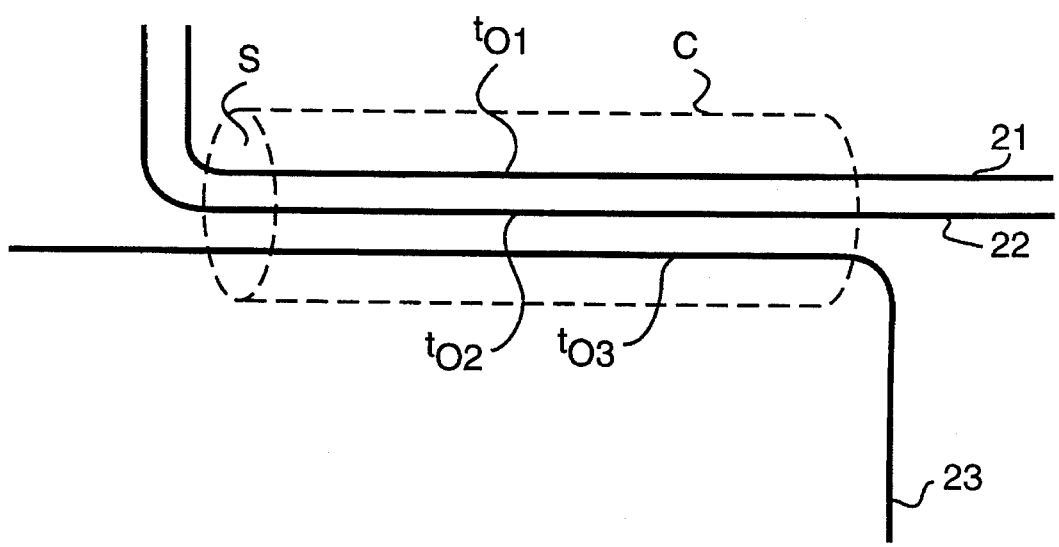
FIG. 2, a possible breakdown of the lines into segments.

FIG. 2 defines one possible breakdown of a line segment, particularly for the case of electrical lines; obviously other breakdown types are possible.

The first step is to define a radius of influence describing a closed curve, for example a circle, inside which line elements are assumed to parasite each other, for example, by the generation of interference. The closed curve delimits a section S which may be the base of a cylinder C. Parts of lines 21, 22 and 23 inside this cylinder C define segments $t_{o1}, t_{o2}$ and $t_{o3}$. Segments inside the cylinder are assumed to interact with each other. In the case of electrical conductors, it is preferable to define the length of the cylinder such that line segments $t_{o1}, t_{o2}$ and $t_{o3}$, are parallel over this entire length. This is because it is easier to solve the electromagnetism equations when the line elements, in this case segments $t_{o1}, t_{o2}$ and $t_{o3}$, are parallel. It is also preferable to make cylinder C as long as possible. This is why one end of the cylinder C is located, for example, at the end of one of its straight sections where at least one of the parts of the line forming its inner segments become non-parallel to the others. For example, cylinder C may be centered on one of its segments. The dimensions of section S in which segments passing through it are assumed to be in interaction, may be defined as a function of the nature of the conductors or dielectrics and dependent on operating frequencies, particularly in the case of networks of conductors. In general the cross section S of cylinder C is very small compared with the cylinder length. For a given network of lines and a given section of influence S, lines in the network are broken down into segments obtained in accordance with segments $t_{o1}, t_{o2}$ and $t_{o3}$ in FIG. 2. Although it is preferable that segments in a cylinder are parallel, they are not necessarily straight.

The breakdown example described above is made such that a segment is a part of a line contained within a prismatic cylinder of given section S, segments of the same cylinder being preferably parallel to each other. The length of each cylinder is defined such that it contains at least one segment extended by another non-parallel segment. When part of a line is not in interaction with other parts of lines, in other words when there is not at least one other part of a line with which it may be contained within a cylinder of given section S, this part of the line forms the sole segment of this cylinder. If this segment is not directly subject to interaction, for example, such as interference, it may nevertheless be affected by parasite currents if other segments along the same line are in interaction with other segments. Matrix calculations of the type defined in relations (1) and (2) are thus carried out for all segments.

According to the invention, the first ordering of segments simplifies the global solution matrix, such as matrix (A) in relation (3), assigns a principle rank denoted r to each segment, and principal ranks are incremented such that segments in interaction, or in the same cylinder in the case of the previous breakdown, have principle ranks with a difference of not more than one unit and all segments in the same line have the same principle rank. Thus, let r be the minimum rank of segments in a given cylinder, all segments in this cylinder will have rank r or r+1 equal to rank r plus one unit. The origin rank 0 is assigned to segments of a line in which at least one segment is in interaction, or contained in the same cylinder as a segment in another line. Apart from this condition, the line containing segments with zero rank may be chosen arbitrarily. It is preferable to exclude any line with no interacting segments from the ordering, since including it in the simulation matrix calculation is indifferent with respect to other lines.

Figure 3:
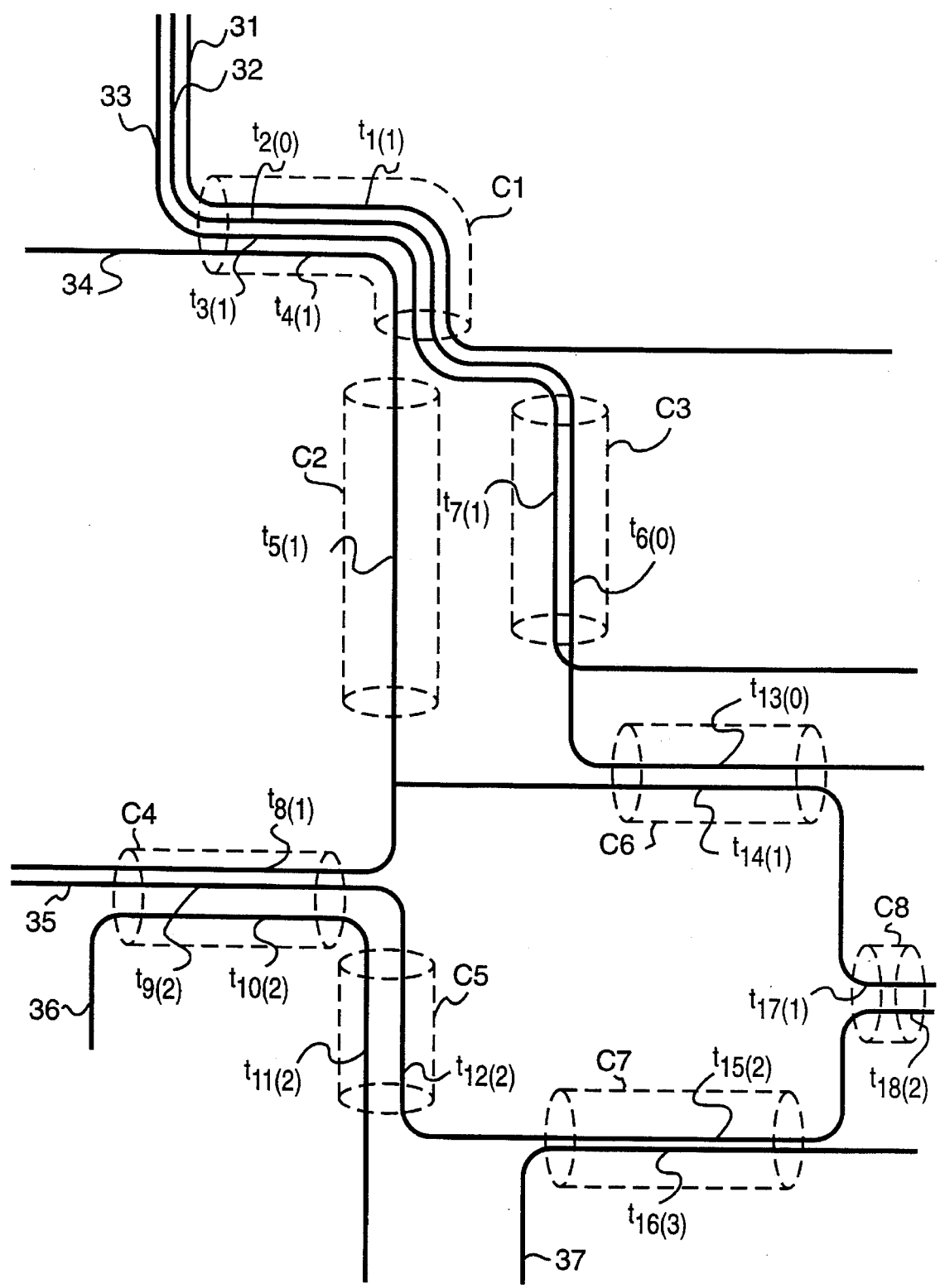
FIGS. 3, 4 and 5, examples of ordering line segments according to the invention.

FIG. 3 shows an example of ordering segments according to the invention. Lines 31, 32, 33, 34, 35, 36, 37 are segments in interaction. For reasons of clarity, not all cylinders in the breakdown have been shown: only eight of them, C1, C2, C3, C4, C5, C6, C7, C8, have been shown. A first cylinder C1 contains four segments $t_1, t_2, t_3, t_4$ belonging to four lines 31, 32, 33 and 34. For example, the principal rank 0 may be assigned to segment $t_2$ in line 32. To facilitate understanding of ordering according to the invention, the principal ranks are shown adjacent to segment marks; these ranks are denoted between parentheses. Other segments $t_1, t_3, t_4$ of cylinder C1 then have a principal rank equal to 1. The second cylinder C2 only contains one segment $t_5$ belonging to line 34 which has a segment of rank 1, and therefore its principal rank is also equal to 1. The third cylinder C3 contains two segments $t_6$ and $t_7$ in which $t_6$ belongs to line 32 and therefore has a principal rank equal to 0 and the other $t_7$ belongs to line 33 and therefore has a principal rank equal to 1. The fourth cylinder C4 contains three segments, one of which $t_8$ belongs to line 34 and therefore has a rank equal to 1, the other two segments $t_9$ and $t_{10}$ belonging to lines 35 and 36 have a rank equal to 2. A fifth cylinder C5 contains two segments $t_{11}$ and $t_{12}$ belonging to lines 35 and 36 respectively, each of which have a segment with principal rank equal to 2. These two segments $t_{11}$ and $t_{12}$ therefore also have a principal rank equal to 2. A sixth cylinder C6 contains two segments $t_{13}$ and $t_{14}$ in which lines 32 and 34 have segments equal to 0 and 1 respectively. These rank numbers are therefore assigned to $t_{13}$ and $t_{14}$ respectively. A seventh cylinder C7 contains two segments $t_{15}$ and $t_{16}$. Since the first, $t_{15}$, belongs to line 35 containing segments with a principal rank equal to 2, it also has this rank whereas the second $t_{16}$ has a principal rank equal to 3. An eighth cylinder C8 contains two segments $t_{17}$ and $t_{18}$, the first $t_{17}$ has a principal rank equal to 1 and the second has a principal rank equal to 2, like the other segments in their respective lines.

When applying ordering according to the invention, a global simulation matrix is therefore made up of segments sorted according to their principle rank. For example, in the case of segments in FIG. 3, the global matrix may be made up in such a way as to be applicable to a column vector in which the components, for example representing electrical excitations, are sorted from the top towards the bottom in the same way as the segments in FIG. 4, segment $t_2(0)$ being followed by segments $t_6(0)$, $t_{13}(0)$, $t_1(1)$, $t_3(1)$, $t_4(1)$, $t_5(1)$, $t_7(1)$, $t_8(1)$, $t_{14}(1)$, $t_{17}(1)$, $t_9(2)$, $t_{10}(2)$, $t_{11}(2)$, $t_{12}(2)$, $t_{15}(2)$, $t_{18}(2)$, $t_{16}(3)$, in order.

The advantage of this ordering according to the invention is that, for a given row or column in the matrix, non-zero elements will not go beyond the rows or columns corresponding to segments with the rank immediately above (r+1) or immediately below (r−1) the rank r of the segment associated with the row or column. This brings non-zero elements closer to the matrix diagonal since rows and columns are sorted as a function of the principal ranks of the segments associated with them.

In order to improve ordering according to the invention, secondary ordering and tertiary ordering may be created according to the invention in order to sort segments with the same principal rank. For this purpose, and for a given principal rank, the secondary rank of a segment corresponds to the rank of its line among the lines containing segments with the same given principal rank, lines having distinct and successive ranks, and origin rank 0 being arbitrarily assigned to any one of these lines.

Figure 4:
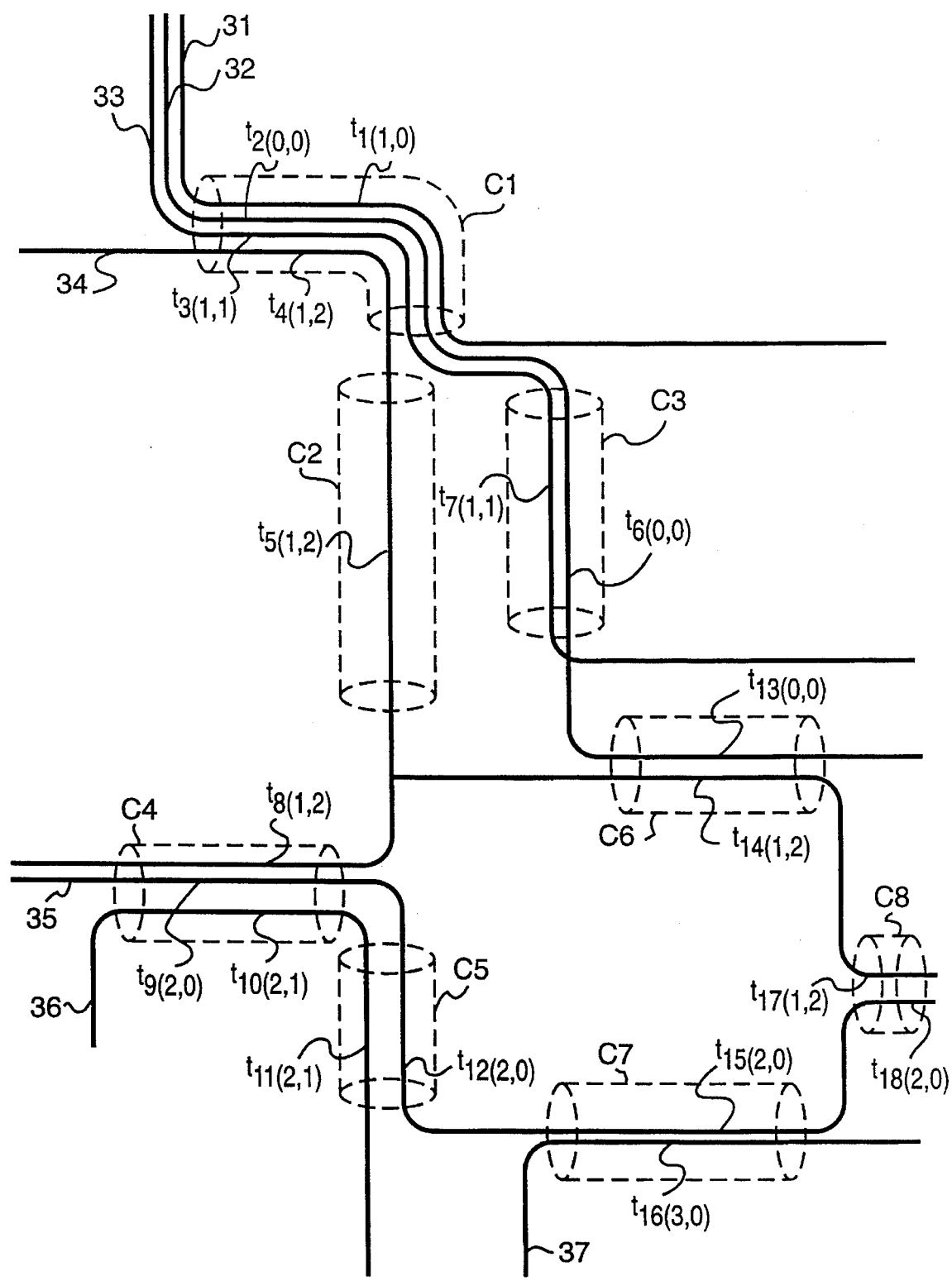

FIG. 4 shows this ordering by secondary ranks according to the invention. Segments and cylinders shown are the same as those in FIG. 3. In the first cylinder, C1, segment $t_2$ of rank equal to 0 has a secondary rank equal to 0, since line 32 is the only line to have segments with principal rank equal to 0. Lines 31, 33 and 34 in the three other segments $t_1$, $t_3$ and $t_4$ with principal rank equal to 1 may, for example, have ranks equal to 0, 1 and 2 respectively, these ranks being the secondary ranks of their segments. To facilitate understanding of sorting according to the invention, FIG. 4 shows segment marks followed by a pair, in which the first component indicates the principal rank and the second component indicates the secondary rank. Segment $t_5$ in the second cylinder C2 belongs to line 34 of rank 2 among lines of segments with principal rank equal to 1, the secondary rank of segment $t_5$ is therefore equal to 2. Similarly the two segments $t_6$ and $t_7$ in the third cylinder C3 have secondary ranks equal to 0 to 1 respectively, and segment $t_8$ in the fourth cylinder C4 has principal rank 1. Since the two other segments $t_9$ and $t_{10}$ of the fourth cylinder C4 have a principal rank equal to 2, $t_9$ may, for example, have a secondary rank equal to 0, and $t_{10}$ may have a secondary rank equal to 1. Consequently, the two segments $t_{11}$ and $t_{12}$ in the fifth cylinder C5 may have secondary ranks equal to 1 and 0 respectively. The two segments $t_{13}$ and $t_{14}$ in the sixth cylinder C6 have secondary ranks of 0 and 2 respectively, $t_{14}$ belonging to line 34 of rank 2 among the lines containing segments with principal rank equal to 1. The two segments $t_{15}$ and $t_{16}$ of the seventh cylinder C7 have secondary ranks equal to 0, segment $t_{16}$ with principal rank 3 being the only one with this rank. Finally the two segments, $t_{17}$ and $t_{18}$ of the eighth cylinder C8 have secondary ranks of 2 and 0 respectively.

Thus, segments of the above mentioned column vector may be ordered using the invention as a function of their principal rank and their secondary rank. In the case of the line segments shown in FIG. 4, the column vector has its components ordered, for example, in the same way as the segments, segment $t_2$ (0,0) being followed by segments

| $t_6(0,0)$, | $t_{13}(0,0)$, | $t_1(0,0)$, | $t_3(1,1)$, | $t_7(1,1)$ |
|---|---|---|---|---|
| $t_4(1,2)$, | $t_5(1,2)$, | $t_8(1,2)$, | $t_{14}(1,2)$, | $t_{17}(1,2)$ |
| $t_9(2,0)$, | $t_{12}(2,0)$, | $t_{15}(2,0)$, | $t_{18}(2,0)$, | $t_{10}(2,1)$ |
| $t_{11}(2,1)$, | $t_{16}(3,0)$. | | | |

The tertiary rank proposed by the invention can be used to create an order for segments with the same principal rank and the same secondary rank. This tertiary rank orders segments in any one line, successive segments preferably having successive tertiary ranks.

This tertiary rank can correspond to a rank of a cylinder on the same line, the tertiary rank of a segment then being the rank of its cylinder.

Figure 5:
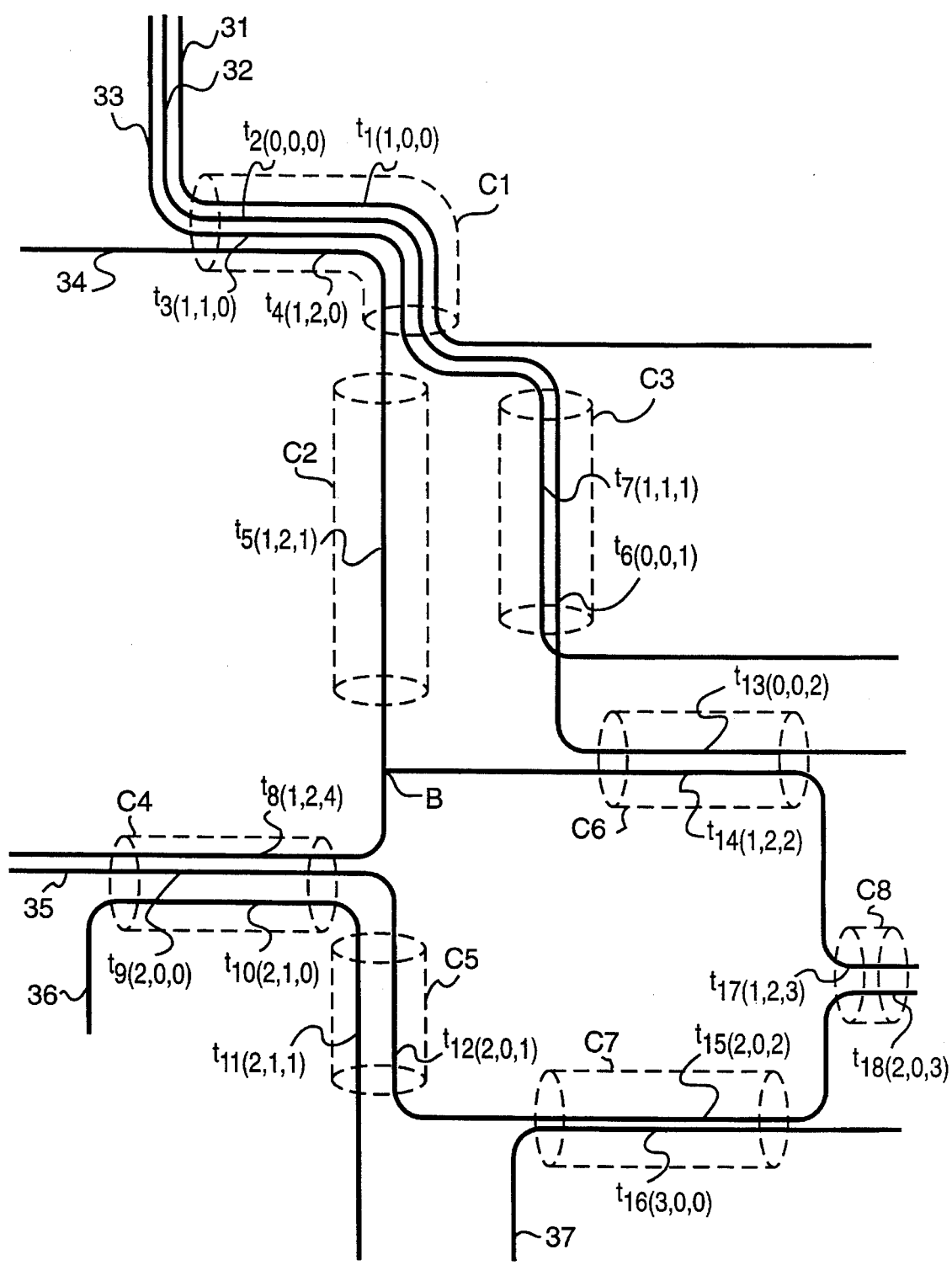

FIG. 5 illustrates ordering according to the invention, with segments being ordered as a function of their principal rank, then within this ordering they are ordered as a function of their secondary rank, then within the latter order they are ordered as a function of their tertiary rank. In order to facilitate understanding of ordering according to the invention, FIG. 5 shows segment marks followed by a triplet in which the first component represents the principal rank, the second component represents the secondary rank and the third component represents the tertiary rank of the segment. For reasons of clarity, segments for which the cylinders are not shown are excluded from this ordering.

The segments in FIG. 5 are the same as those in FIGS. 3 and 4 and in particular have the same principal and secondary ranks as those in FIG. 4. For example, segments in the first cylinder C1 all have a tertiary rank equal to 0, the origin tertiary rank 0 being assigned to these segments with respect to other segments of their respective lines. Segment $t_5$ in the second cylinder C2 then has tertiary rank 1, as have the two segments $t_6$ and $t_7$ in the third cylinder C3, and the two segments $t_{13}$ and $t_{14}$ in the sixth cylinder have tertiary rank 2. The two segments in the eighth cylinder C8 have tertiary rank 3. Since line 34 has a junction point B, its segment $t_8$ contained in the fourth cylinder has a tertiary rank above the rank of segment $t_{17}$ with the same principal and secondary ranks contained in the eighth cylinder C8, therefore, the tertiary rank of this segment $t_8$ is equal to 4.

Starting from a junction, such as junction B in line 34, it is possible to consider junctions as being new lines, in which segments have principal and secondary ranks different to ranks in other segments before the junction.

The other two segments in the fourth cylinder C4 have the same tertiary rank equal to 0. The two segments $t_{11}$ and $t_{12}$ on the fifth cylinder have the next tertiary rank, in other words equal to 1. Finally, segment $t_{16}$ on the seventh cylinder C7 with principal rank equal to 3 has a tertiary rank equal to 0, whereas the other segment $t_{15}$ in this cylinder C7 follows segment $t_{12}$ with tertiary rank equal to 1, and therefore has a tertiary rank equal to 2.

According to the invention, the segments on FIG. 5 may finally be ordered starting from segment $t_2$, as follows:

$t_2(0,0,0)$
$t_6(0,0,1)$
$t_{13}(0,0,2)$
$t_1(1,0,0)$
$t_3(1,1,0)$
$t_7(1,1,1)$
$t_4(1,2,0)$
$t_5(1,2,1)$
$t_{14}(1,2,2)$
$t_{17}(1,2,3)$
$t_8(1,2,4)$
$t_9(2,0,0)$
$t_{12}(2,0,1)$
$t_{15}(2,0,2)$
$t_{18}(2,0,3)$
$t_{10}(2,1,0)$
$t_{11}(2,1,1)$
$t_{16}(3,0,0)$

For a simulation application to estimate interference phenomena between lines, the calculation matrix may, for example, be defined such that the elements of each of its rows are applicable to segments ordered according to the invention, and that the rows are ordered so as to obtain a response vector in which components have the same order as their associated segments ordered according to the invention.

Thus, in the breakdown example in FIGS. 3, 4 and 5, the calculation matrix may be built up as a function of the order of components of the input vector corresponding to the previously determined ordering, since each component of the input vector represents, for example, an electrical excitation of a given segment.

Compositions of global matrices made by the disposer, particularly obtained from Maxwell's equations in the case of electrical lines in printed circuits or interconnection substrates, for example, have demonstrated that by ordering the columns and rows of the matrix in accordance with the invention applied to the segments to which they were associated, the elements in the global matrix are close to its diagonal. Since the order of these matrices is generally very high, this ordering of line segments in a network considerably reduces memory space and significantly reduces the amount of the calculation time necessary for simulations.

Ordering according to the invention may be applied to all types of networks in which line segments interact with each other and whenever a simulation is necessary to predict their behavior, particularly in the design phase.

I claim:

1. In a method for simulating crosstalk interference of adjacently situated network lines by analyzing non-zero elements of a global matrix having corresponding ordered network line segments, the ordering of line segments comprising the steps:

determining which segments experience interference;

assigning a single principal rank to each segment, the principal ranks between segments that interfere with one another being incremented and differing by no more than 1 thus simplifying the global matrix;

non-zero elements of the global matrix being grouped around a diagonal of the matrix;

the principal ranks of all segments of a single line being the same; and an origin principal rank zero being assigned to the segments of a single line of the network, wherein at least one of the segments of the line experiences interference with at least one other segment in another line.

2. The method set forth in claim 1 wherein a secondary rank is further assigned to each segment corresponding to the rank of the segment's line among lines containing segments of the same principal rank;

the secondary ranks for segments of the same principal rank further being successively numbered.

3. The method set forth in claim 1 wherein each segment further has a tertiary rank defining its rank among other segments of the same line.

4. The method set forth in claim 3 wherein two adjacent segments in the same line have successive tertiary ranks.

5. The method set forth in claim 2 further wherein the segments are ordered as a function of their secondary rank among segments with the same principal rank.

6. The method set forth in claim 3 further wherein the segments are ordered as a function of their tertiary rank among segments with the same principal and secondary rank.

7. The method set forth in claim 1 wherein the lines are electrical conductors.

8. In a method for simulating crosstalk interference of adjacently situated network lines by analyzing non-zero elements of a global matrix having corresponding ordered network line segments, the ordering of line segments comprising the steps:

determining which segments experience interference;

defining a cylindrical zone about each network section having a plurality of substantially parallel segments therein that experience interference;

assigning a single principal rank to each segment, the principal ranks between segments that interfere with one another, within a particular cylindrical zone, being incremented and differing by no more than 1 thus simplifying the global matrix;

non-zero elements of the global matrix being grouped around a diagonal of the matrix;

the principal ranks of all segments of a single line being the same; and an origin principal rank zero being assigned to the segments of a single line of the network, wherein at least one of the segments of the line experiences interference with at least one other segment in another line.

9. The method set forth in claim 8 wherein at least one of the segments of at least one cylindrical zone extends to a further non-parallel segment, existing at the output of the cylindrical zone.

10. The method set forth in claim 8 wherein preselected cylindrical zones are centered about respective preselected segments.

* * * * *